United States Patent
Wang et al.

(10) Patent No.: US 10,290,422 B1
(45) Date of Patent: May 14, 2019

(54) CAPACITORS AND INTEGRATED ASSEMBLIES WHICH INCLUDE CAPACITORS

(71) Applicant: Micron Technology, Inc., Boise, ID (US)

(72) Inventors: Kuo-Chen Wang, Higashihiroshima (JP); Hiroshi Amaike, Higashihiroshima (JP); Kota Hattori, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/814,882

(22) Filed: Nov. 16, 2017

(51) Int. Cl.
*H01G 4/005* (2006.01)
*H01G 4/018* (2006.01)
*H01G 4/40* (2006.01)

(52) U.S. Cl.
CPC ............ *H01G 4/005* (2013.01); *H01G 4/018* (2013.01); *H01G 4/40* (2013.01)

(58) Field of Classification Search
None
See application file for complete search history.

(56) References Cited

U.S. PATENT DOCUMENTS

| | | | | |
|---|---|---|---|---|
| 6,255,187 | B1* | 7/2001 | Horii | H01L 21/2885 257/E21.009 |
| 7,659,602 | B2* | 2/2010 | Tegen | H01L 28/86 257/499 |
| 9,997,520 | B2* | 6/2018 | Cheng | H01L 27/10808 |
| 2001/0051131 | A1* | 12/2001 | Unger | A61K 49/223 424/9.5 |
| 2003/0001190 | A1* | 1/2003 | Basceri | H01L 21/76888 257/306 |
| 2004/0051130 | A1* | 3/2004 | Miyajima | H01L 27/10817 257/301 |
| 2004/0256654 | A1* | 12/2004 | Korner | H01L 28/55 257/306 |
| 2006/0046378 | A1* | 3/2006 | Choi | H01L 21/7687 438/238 |
| 2007/0111431 | A1* | 5/2007 | Engelhardt | H01G 4/228 438/253 |
| 2007/0170487 | A1 | 7/2007 | Heitmann et al. | |
| 2009/0294907 | A1 | 12/2009 | Tegen et al. | |
| 2013/0127012 | A1 | 5/2013 | Koo | |
| 2015/0221718 | A1 | 8/2015 | Rhie | |
| 2017/0033112 | A1 | 2/2017 | Cheng et al. | |

FOREIGN PATENT DOCUMENTS

WO PCT/US2018/041737 1/2019

\* cited by examiner

*Primary Examiner* — Dion Ferguson
(74) *Attorney, Agent, or Firm* — Wells St. John P.S.

(57) ABSTRACT

Some embodiments include a capacitor. The capacitor has a first electrode with a lower pillar portion, and with an upper container portion over the lower pillar portion. The lower pillar portion has an outer surface. The upper container portion has an inner surface and an outer surface. Dielectric material lines the inner and outer surfaces of the upper container portion, and lines the outer surface of the lower pillar portion. A second electrode extends along the inner and outer surfaces of the upper container portion, and along the outer surface of the lower pillar portion. The second electrode is spaced from the first electrode by the dielectric material. Some embodiments include assemblies (e.g., memory arrays) which have capacitors. Some embodiments include methods of forming capacitors.

16 Claims, 18 Drawing Sheets

CAPACITORS AND INTEGRATED ASSEMBLIES WHICH INCLUDE CAPACITORS

TECHNICAL FIELD

Capacitors, integrated assemblies including capacitors, and methods of forming integrated assemblies having capacitors.

BACKGROUND

Memory is one type of integrated circuitry, and is used in electronic systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

An example memory is dynamic random access memory (DRAM). The DRAM unit cells may each comprise a capacitor in combination with a transistor. Charge stored on the capacitors of the DRAM unit cells may correspond to memory bits.

It would be desirable to develop improved capacitors suitable for utilization in DRAM and/or other integrated circuitry.

DETAILED DESCRIPTION OF THE ILLUSTRATED EMBODIMENTS

Some embodiments include capacitors in which a first electrode (a storage node) includes an upper container portion over a lower pillar portion. A dielectric material is along inner and outer sidewalls of the container portion, and along an outer sidewall of the pillar portion. A second electrode (a plate electrode) is also along the inner and outer sidewalls of the container portion, and along the outer sidewall of the pillar portion; and is spaced from the first electrode by the dielectric material.

Some embodiments include recognition that container-type capacitors may beneficially provide higher capacitance than pillar-type capacitors of analogous dimensions due to increased surface area along storage nodes of container-type capacitors relative to storage nodes of pillar-type capacitors. It is also recognized that pillar-type capacitors may beneficially be more structurally stable than container-type capacitors due to the rigidity provided by the pillar-shaped storage nodes. Further, it is recognized that there may be a wider spread of capacitances across an array of container-type capacitors as compared to pillar-type capacitors due to difficulties associated with the fabrication of container-type capacitors.

Some embodiments include new capacitor configurations having storage nodes which combine container-type structures with pillar-type structures. Such may enable benefits associated with container-type configurations to be achieved together with benefits associated with pillar-type configurations, while reducing (or even eliminating) disadvantages associated with either or both of container-type configurations and pillar-type configurations. In some embodiments, lower portions of capacitor storage nodes have pillar-type configurations, and upper portions of the capacitor storage nodes have container-type configurations. Example embodiments are described with reference to FIGS. 1-16.

Figure 1:
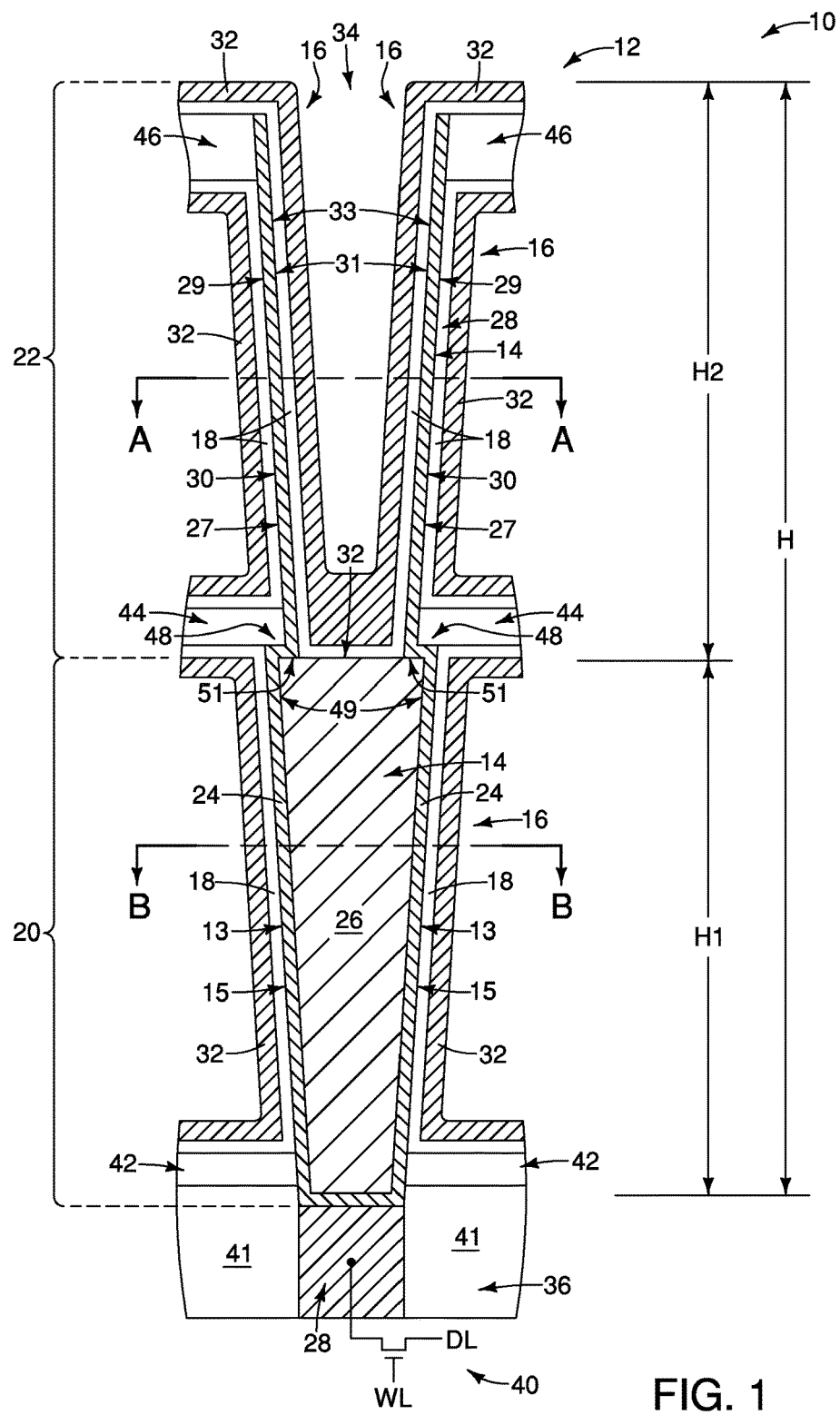
FIG. 1 is a diagrammatic cross-sectional view of an example capacitor configuration.
Figure 1A:
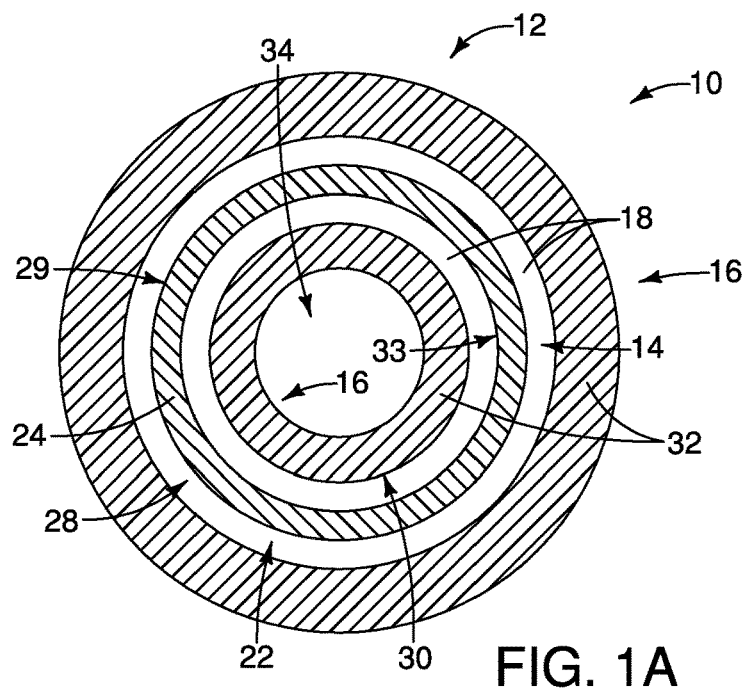
FIGS. 1A and 1B are sectional views along the lines A-A and B-B of FIG. 1, respectively.
Figure 1B:
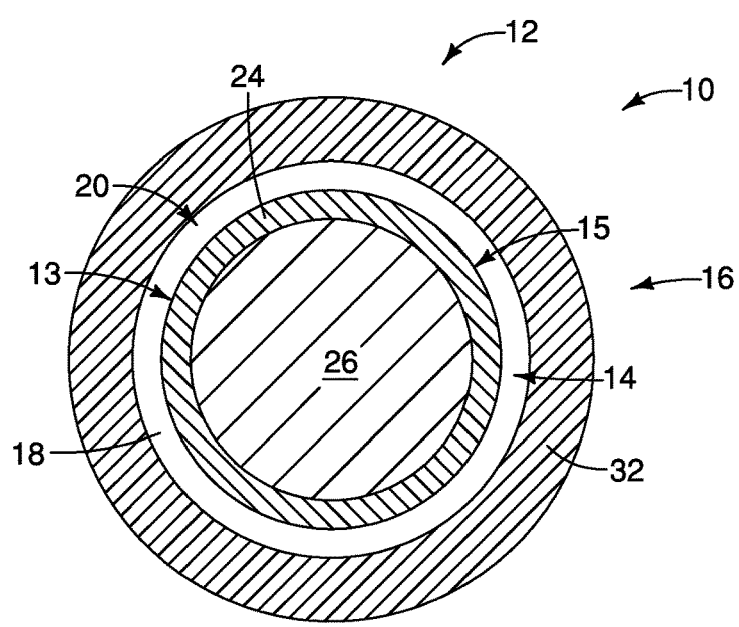

Referring to FIGS. 1, 1A and 1B, a region of an example assembly 10 is illustrated, with such region comprising an example capacitor 12.

The capacitor 12 includes a first electrode 14, a second electrode 16, and dielectric material 18 between the first and second electrodes.

The first electrode 14 includes a lower pillar portion 20, and an upper container portion 22 over the lower pillar portion. A conductive liner 24 has a lower portion within the lower pillar portion 20 of the first electrode 16, and has an upper portion within the upper container portion 22 of the first electrode 16.

The lower pillar portion 20 also includes a conductive fill material 26 laterally surrounded by the conductive liner 24.

The conductive liner 24 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some example embodiments, the conductive liner 24 may comprise, consist essentially of, or consist of TiN (titanium nitride); where the chemical formula indicates primary constituents rather than a specific stoichiometry.

The conductive fill material 26 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some example embodiments, the conductive fill material 26 comprises, consists essentially of, or consists of doped silicon (e.g., conductively-doped polycrystalline silicon; such as, for example, n-type doped polycrystalline silicon).

The lower pillar portion 20 of the first electrode 14 has an outer edge 13, and an outer surface 15 along such outer edge. The dielectric material 18 may be considered to be configured as a liner which extends along the outer surface 15.

The upper container portion 22 of the first electrode 14 includes an upwardly-opening container 28. The container 28 includes a sidewall 30 corresponding to the upper portion of the conductive liner 24, and includes a bottom 32 corresponding to an upper surface of the conductive fill material 26. The upper container portion 22 of the first electrode 14 has an outer surface 29 along an outer edge 27 of the sidewall 30; and has an inner surface 33 which extends along an inner edge 31 of the sidewall 30, as well as along the upper surface 32 of the conductive fill material 26. The dielectric material 18 lines the inner and outer surfaces 29 and 33 of the upper container portion 22.

The dielectric material 18 may comprise any suitable insulative composition(s); and in some embodiments may comprise one or more of silicon dioxide, silicon nitride, zirconium oxide, aluminum oxide, etc. In some example embodiments, the dielectric material 18 may comprise one or more high-k materials; where the term high-k means a dielectric constant greater than that of silicon dioxide. For instance, in some example embodiments the dielectric material 18 may comprise, consist essentially of, or consist of zirconium oxide.

The second electrode 16 of the capacitor 12 comprises a conductive material 32. The conductive material 32 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some example embodiments, the conductive material 32 may comprise, consist essentially of, or consist of titanium nitride.

The second electrode 16 of the capacitor 12 is along the outer surface 15 of the lower pillar portion 20 of the first electrode 14, and is also along the inner and outer surfaces 33 and 29 of the upper container portion 22 of the first electrode 14. The second electrode 16 is spaced from the first electrode 14 by the dielectric material 18.

In the illustrated embodiment, an opening 34 remains within a center of the upwardly-opening container 30. In other embodiments, the opening 34 may be filled with material. The material filling the opening 34 may be conductive material (e.g., in some embodiments, conductively-doped silicon may be provided to fill the opening 34), or may be insulative material.

The capacitor 12 is supported by a base 36. The base 36 may comprise any suitable material(s), and in some embodiments comprises a conductive pillar 38 which is electrically coupled with the first electrode 14. The conductive pillar may also be coupled with a first source/drain region of a transistor 40 (with the transistor 40 being schematically shown in FIG. 1). The transistor 40 may comprise a gate electrically coupled with a wordline WL, and may comprise a second source/drain region electrically coupled with a digit line DL. The capacitor 12 may be one of a large number of substantially identical capacitors utilized within a memory array (e.g., a memory array analogous to the DRAM array discussed below with reference to FIG. 16); where the term "substantially identical" means identical to within reasonable tolerances of fabrication and measurement.

The conductive pillar 38 may extend through an insulative material 41. Such insulative material may comprise any suitable composition or combination of compositions; and in some embodiments may comprise silicon dioxide.

The base 36 may be part of a semiconductor substrate, and specifically may be supported by an underlying semiconductor material. Such semiconductor material may, for example, comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. The source/drain regions of the transistor 40 may extend into the semiconductor material of the semiconductor substrate in some embodiments.

Support structures 42, 44 and 46 provide lateral support to the capacitor 12. The support structures 42, 44 and 46 may be together considered to form an insulative lattice which supports the capacitor 12. In the illustrated embodiment, the first support structure 42 is along a bottom of the capacitor 12, the second support structure 44 is approximately centered relative to the capacitor 12, and the third support structure 44 is along a top of the capacitor 12. In other embodiments, the support structures may be provided at other locations along the capacitor 12. Also, although three support structures 42, 44 and 46 are illustrated; in other embodiments there may be more than three support structures, or fewer than three support structures.

The support structures 42, 44 and 46 may comprise any suitable composition(s). In some embodiments, all of the support structures 42, 44 and 46 may be a same composition as one another, and in other embodiments at least one of the support structures may be a different composition relative to one or more others of the support structures. In some embodiments, all of the support structures may comprise, consist essentially of, or consist of silicon nitride. The support structures 42, 44 and 46 may have any suitable vertical thicknesses, and may be the same vertical thicknesses as one another or may be of different vertical thicknesses relative to one another. In the illustrated embodiment, the upper support structure 46 is shown to have a larger vertical thickness than the other support structures 42 and 44. In some embodiments, the upper support structure 46 may be formed to be thicker than the other support structures in that it provides stability to the upper part of the container portion 22, whereas the other support structures 42 and 44 are providing support along the bases of the container portion 22 and the pillar portion 20; and the upper part of the container portion 22 may be more structurally unstable than bases of the container portion 22 and the pillar portion 20.

The upper container portion 22 of the first electrode 14 may join to the lower pillar portion 20 along any suitable interface. In the illustrated embodiment, a step 48 is along the conductive liner 24 in a location proximate to where the upper container portion 22 joins with the lower pillar portion 20. The liner 24 may be considered to comprise an upper portion within the container portion 22, and to comprise a lower portion within the pillar portion 20; and accordingly, the step 48 may be considered to be proximate the location where the upper portion of the conductive liner 24 joins to the lower portion of the conductive liner. In some embodiments, the step 48 may be considered to include a region 51 of the upper portion of the conductive liner 24 which is laterally inset relative to an inner edge 49 of the lower portion of the conductive liner. Alternatively, the step 48 may be considered to comprise a region of the outer edge 27 of the upper portion of the conductive liner 24 which is laterally inward of the outer edge 13 of the lower portion of the conductive liner.

In the illustrated embodiment, the support structure 44 (i.e., a portion of the supporting insulative lattice) is directly against an outer edge of the step 48.

The lower pillar portion 20 may be considered to have a height H1, and the upper container portion 22 may be considered to have a height H2. The capacitor 12 may be considered to have a total height H which is a sum of the heights H1 and H2. The relative height of the lower pillar portion is preferably sufficient to provide adequate support to the capacitor 12, and yet small enough to enable a substantial amount of the capacitance within the capacitor 12 to be provided by the upper container portion 22. In some embodiments, the first height H1 of the pillar portion 20 will be at least about one-half of the total height H of the capacitor 12, and in some embodiments will be less than about one-half of the total height H. In some embodiments, the first height H1 of the pillar portion 20 will be within a range of from about 10% of the total height H to about 75% of such total height; within a range of from about 10% of the total height H to about 60% of such total height; within a range of from about 10% of the total height H to about 50% of such total height; within a range of from about 25% of the total height H to about 50% of such total height, etc.

Figure 2:
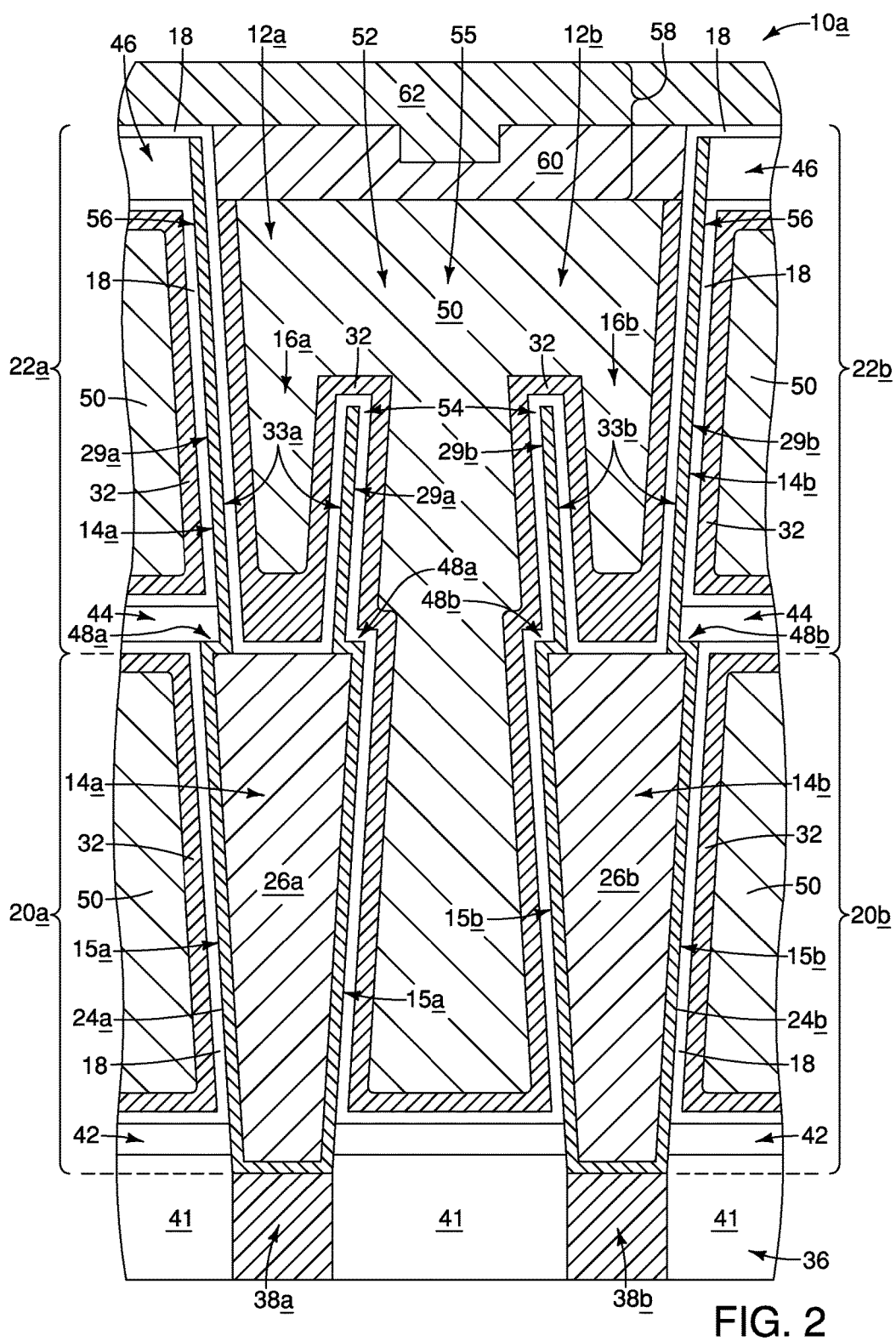
FIG. 2 is a diagrammatic cross-sectional view of an example assembly having a neighboring pair of example capacitor configurations.

The capacitor 12 of FIG. 1 is an example configuration having a container-type portion over a pillar-type portion. In other embodiments, other configurations may be utilized. For instance, FIG. 2 shows a region of an assembly 10a comprising a pair of neighboring capacitors 12a and 12b; with each of the capacitors 12a and 12b comprising a bottom electrode (14a, 14b) having a container-type upper portion (22a, 22b) over a pillar-type lower portion (20a, 20b).

In some embodiments, the capacitor 12a may be referred to as a first capacitor, and the capacitor 12b may be referred to as a second capacitor. The first capacitor 12a has a first bottom electrode 14a. The first bottom electrode includes a first upper container portion 22a over a first lower pillar portion 20a. The first lower pillar portion comprises a first pillar outer surface 15a; and the first upper container portion comprises a first container inner surface 33a, and a first container outer surface 29a. The second capacitor 12b has a second bottom electrode 14b. The second bottom electrode includes a second upper container portion 22b over a second lower pillar portion 20b. The second lower pillar portion comprises a second pillar outer surface 15b; and the second upper container portion comprises a second container inner surface 33b, and a second container outer surface 29b.

The dielectric material 18 is along the first pillar outer surface 15a, the first container inner surface 33a, the first container outer surface 29a, the second pillar outer surface 15b, the second container inner surface 33b, and the second container outer surface 29b.

The first capacitor 12a has a first upper electrode 16a extending along the first bottom electrode 14a, and spaced from the first bottom electrode by the dielectric material 18. The second capacitor 12b has a second upper electrode 16b extending along the second bottom electrode 14b, and spaced from the second bottom electrode by the dielectric material 18. In the illustrated embodiment, the upper electrodes 16a and 16b are electrically coupled with one another, and may be considered to be regions of a common upper electrode 55 associated with both of the capacitors 12a and 12b.

The common upper electrode 55 comprises the conductive material 32 described above with reference to FIG. 1, and further comprises additional conductive material 50. The additional conductive material 50 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the additional conductive material 50 may comprise, consist essentially of, or consist of conductively-doped silicon (e.g., n-type polycrystalline silicon).

A recess 52 extends downwardly into the first and second upper container portions 22a and 22b, and partially overlaps each of such first and second upper container portions. Regions 54 of the upper container portions 22a/22b are recessed, and regions 56 of the upper container portions 22a/22b are not recessed (i.e., remain non-recessed).

A conductive interconnect 58 is electrically coupled with the common upper electrode 55, and in the shown embodiment has a portion directly over the recessed regions 54 of the upper container portions 22a/22b. The conductive interconnect 58 may be utilized to couple the common upper electrode 55 to a suitable reference voltage (e.g., ground, VCC/2, etc.). The conductive interconnect 58 may comprise any suitable composition or combination of compositions. In the illustrated embodiment, the conductive interconnect 58 includes a first material 60 directly against the common upper electrode 55, and includes a second material 62 over the first material. The first and second materials 60 and 62 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the first material 60 may comprise, consist essentially of, or consist of conductively-doped semiconductor material (e.g., conductively-doped silicon); and the second material 62 may be a metal-containing material. In some example embodiments, the second material 62 may comprise, consist essentially of, or consist of tungsten. In some embodiments, the materials 60 and 50 may comprise a same composition as one another (for instance, both may be n-type doped polycrystalline silicon), and accordingly may merge with one another rather than being the discrete separate materials shown in FIG. 2.

The support structures 42, 44 and 46 are provided adjacent the capacitors 12a and 12b, and may be considered to be configured as a supporting insulative lattice which provides structural support to the capacitors. In the shown embodiment, the upper support structure 46 of the insulative lattice is directly against upper portions of the non-recessed regions 56 of the first and second upper container portions 22a and 22b.

The first and second capacitors 12a and 12b comprise first and second steps 48a and 48b, respectively; with such steps being analogous to the step 48 described above with reference to FIG. 1. The support structure 44 of the insulative lattice is directly against the first and second steps 48a and 48b.

The first and second capacitors 12a and 12b are shown to be supported by the base 36. Conductive pillars 38a and 38b are coupled with the bottom electrodes 14a and 14b of the first and second capacitors 12a and 12b. Transistors analogous to the transistor 40 of FIG. 1 may be coupled to the bottom electrodes 14a and 14b through the conductive pillars 38a and 38b (such transistors are not shown in FIG. 2). In some embodiments, the capacitors 12a and 12b may be considered to be representative of a large number of capacitors formed across a memory array (e.g., a memory array analogous to the DRAM array discussed below with reference to FIG. 16).

The capacitors described above may be fabricated with any suitable processing. Example processing which may be utilized to form the neighboring capacitors 12a and 12b of FIG. 2 is described with reference to FIGS. 3-15.

Figure 3:
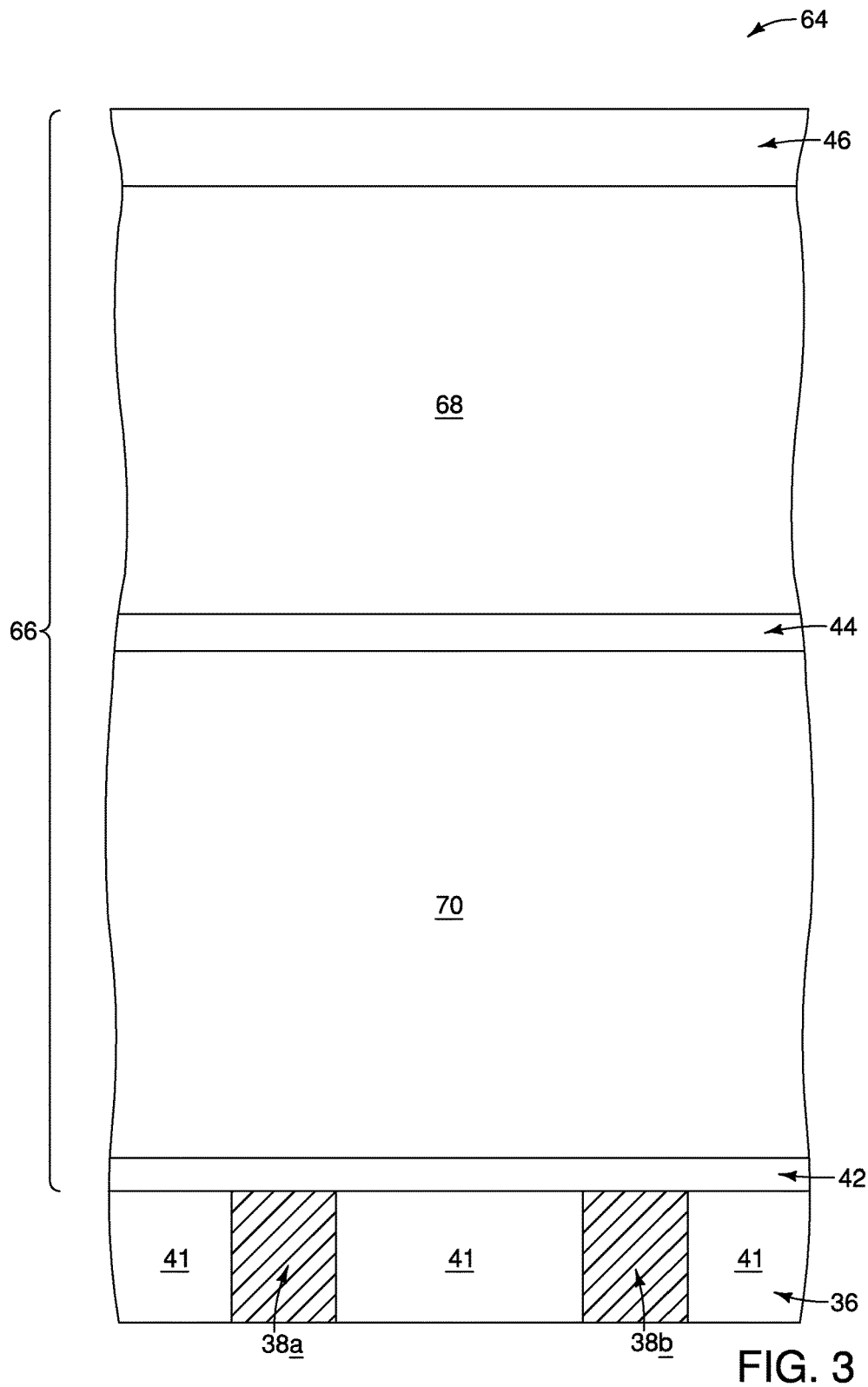
FIGS. 3-15 are diagrammatic cross-sectional views of an example construction at example process stages of an example method for forming the example assembly of FIG. 2. The construction of FIG. 15 is identical to the assembly of FIG. 2.

Referring to FIG. 3, a construction 64 comprises a stack 66 formed over the base 36. The stack 66 includes the support structures 42, 44 and 46; which may be referred to as lattice layers. The lattice layers 42, 44 and 46 may comprise any suitable composition or combination of compositions; and in some embodiments may comprise, consist essentially of, or consist of silicon nitride.

The stack 66 comprises a first sacrificial material 68 over a second sacrificial material 70, and in the shown embodiment the first and second sacrificial materials are spaced from one another by the lattice layer 44. The first and second sacrificial materials 68 and 70 may comprise any suitable composition(s). In some embodiments, the first sacrificial material may comprise, consist essentially of, or consist of silicon oxide or amorphous silicon; and the second sacrificial material may comprise, consist essentially of, or consist of borophosphosilicate glass.

The various structures of the stack 66 may be formed utilizing any suitable processing; including, for example, atomic layer deposition (ALD), chemical vapor deposition (CVD), plasma enhanced chemical vapor deposition (PECVD), etc.

The various structures of the stack 66 may be formed to any suitable vertical thicknesses. In some embodiments, the lattice layers 42 and 44 will be formed to vertical thicknesses within a range of from about 10 nanometers (nm) to about 50 nm (e.g., vertical thicknesses of about 20 nm), the lattice layer 46 will be formed to a vertical thickness within a range of from about 150 nm to about 300 nm (e.g., a vertical thickness of about 200 nm), the first sacrificial material 68 will be formed to a vertical thickness within a range of from about 400 nm to about 700 nm (e.g., a vertical thickness of about 450 nm), and the second sacrificial material 70 will be formed to a vertical thickness within a range of from about 500 nm to about 800 nm (e.g., a vertical thickness of about 600 nm).

The base 36 comprises the conductive pedestals 38a and 38b. In some applications, such conductive pedestals may be coupled with source/drain regions of transistors (not shown in FIG. 3, but such transistors may be analogous to the transistor 40 described above with reference to FIG. 1).

Figure 4:
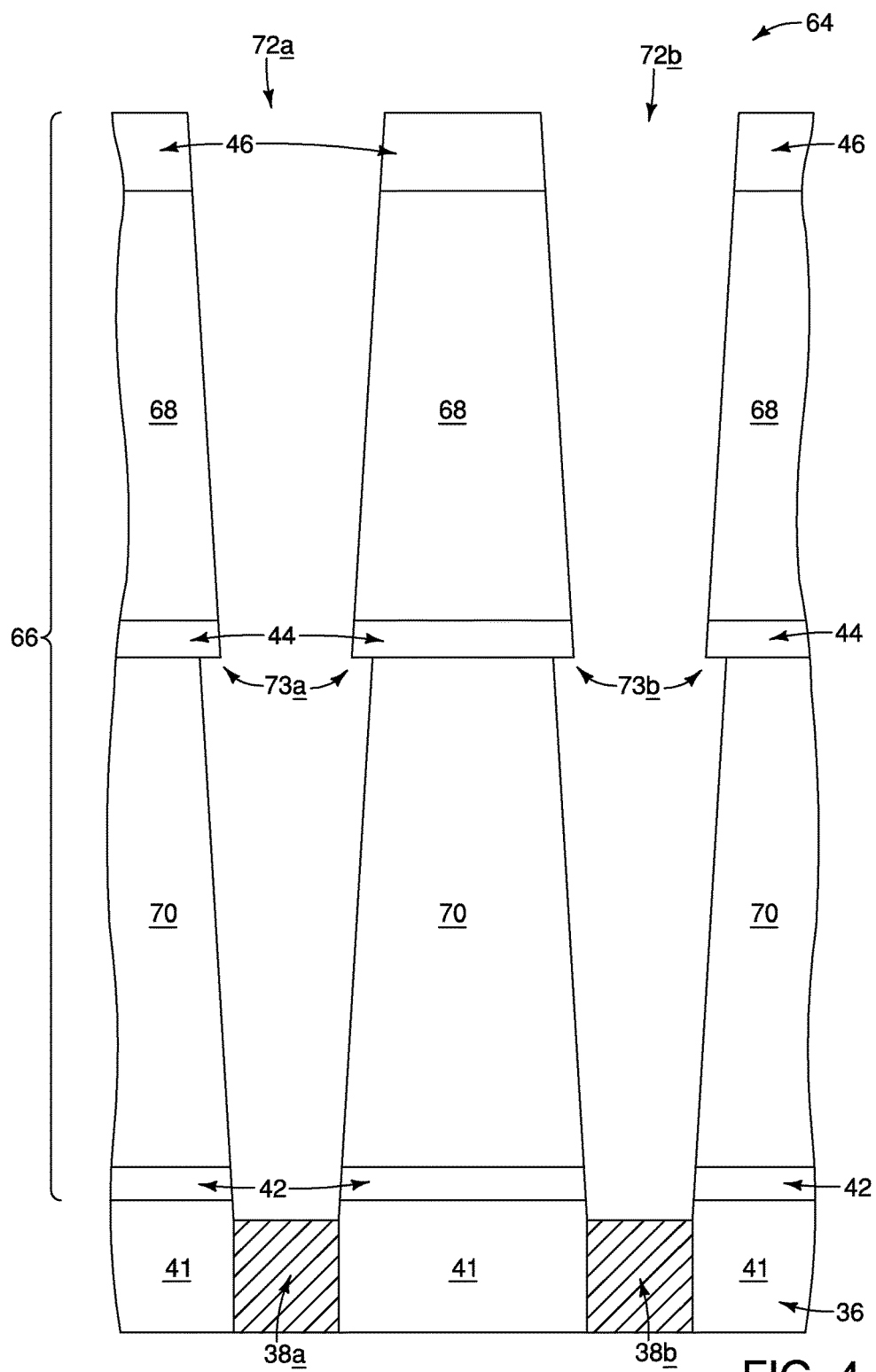

Referring to FIG. 4, openings 72a and 72b are formed through the stack 66 to expose upper surfaces of the conductive pedestals 38a and 38b. The openings 72a and 72b may be considered to be a neighboring pair of first openings. Although only two openings are shown, it is to be understood that such openings may be representative of a large number of openings formed through the stack during fabrication of integrated circuitry (e.g., during fabrication of capacitors associated with a memory array).

The openings 72a and 72b may be formed utilizing any suitable processing. For instance, in some embodiments a patterned mask (not shown) may be provided over an upper surface of stack 66 to define locations of the openings 72a and 72b. Subsequently, one or more suitable etches may be utilized to transfer a pattern from the patterned mask into the stack and thereby fabricate the openings 72a and 72b, and then the mask may be removed to leave the construction shown in FIG. 4. In the illustrated embodiment, the etching undercuts sacrificial material 70 beneath the lattice layer 44, and accordingly forms inset regions 73a and 73b extending under the lattice layer 44 within the openings 72a and 72b, respectively. Such inset regions may result if the etching conditions utilized to extend the openings 72a and 72b through the second sacrificial material 70 have an isotropic component even though the conditions are primarily anisotropic. The sizes of the inset regions 73a and 73b may be controlled by controlling the relative amount of the isotropic component and the anisotropic component of the etch utilized to extend the openings 72a and 72b through the sacrificial material 70.

Figure 5:
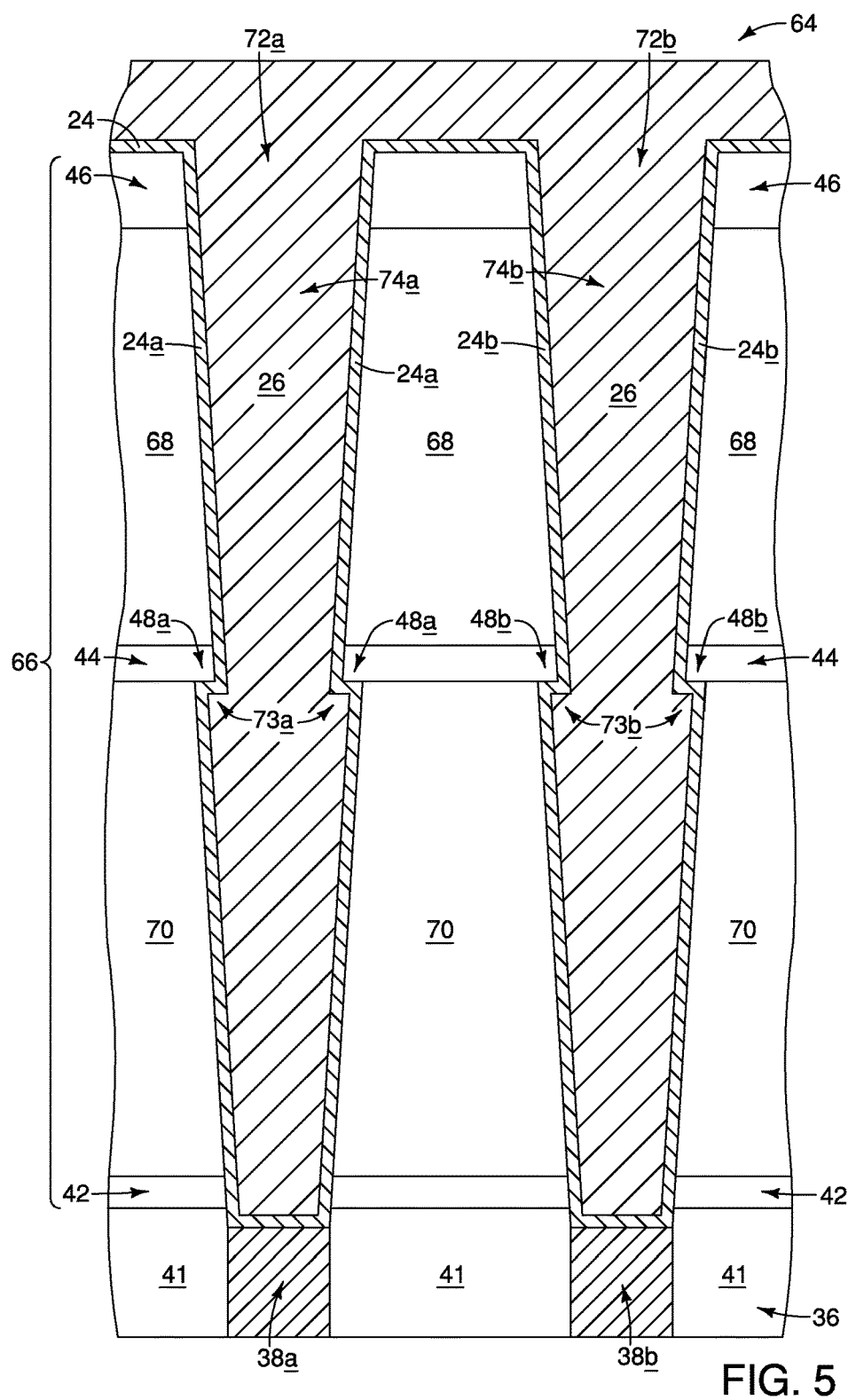

Referring to FIG. 5, the conductive liner 24 is formed within the openings 72a and 72b to narrow the openings, and the conductive fill material 26 is provided to fill the narrowed openings. Eventually, the conductive liner 24 is shown to comprise a region corresponding to a first conductive liner 24a within the first opening 72a, and a region corresponding to second conductive liner 24b within the second opening 72b. The first and second conductive liners 24a and 24b will be separated from one another at a processing stage described below with reference to FIG. 9.

The first conductive liner 24a has a first step 48a extending along the first inset region 73a, and the second conductive liner 24b has a second step 48b extending along the second inset region 73b.

The conductive liner 24 and conductive fill material 26 may comprise the compositions described above with reference to FIG. 1.

The conductive liner 24a and the conductive fill material 26 within the first opening 72a together form a first conductive structure 74a; and the conductive liner 24b and the conductive fill material 26 within the second opening 72b together form a second conductive structure 74b.

Figure 6:
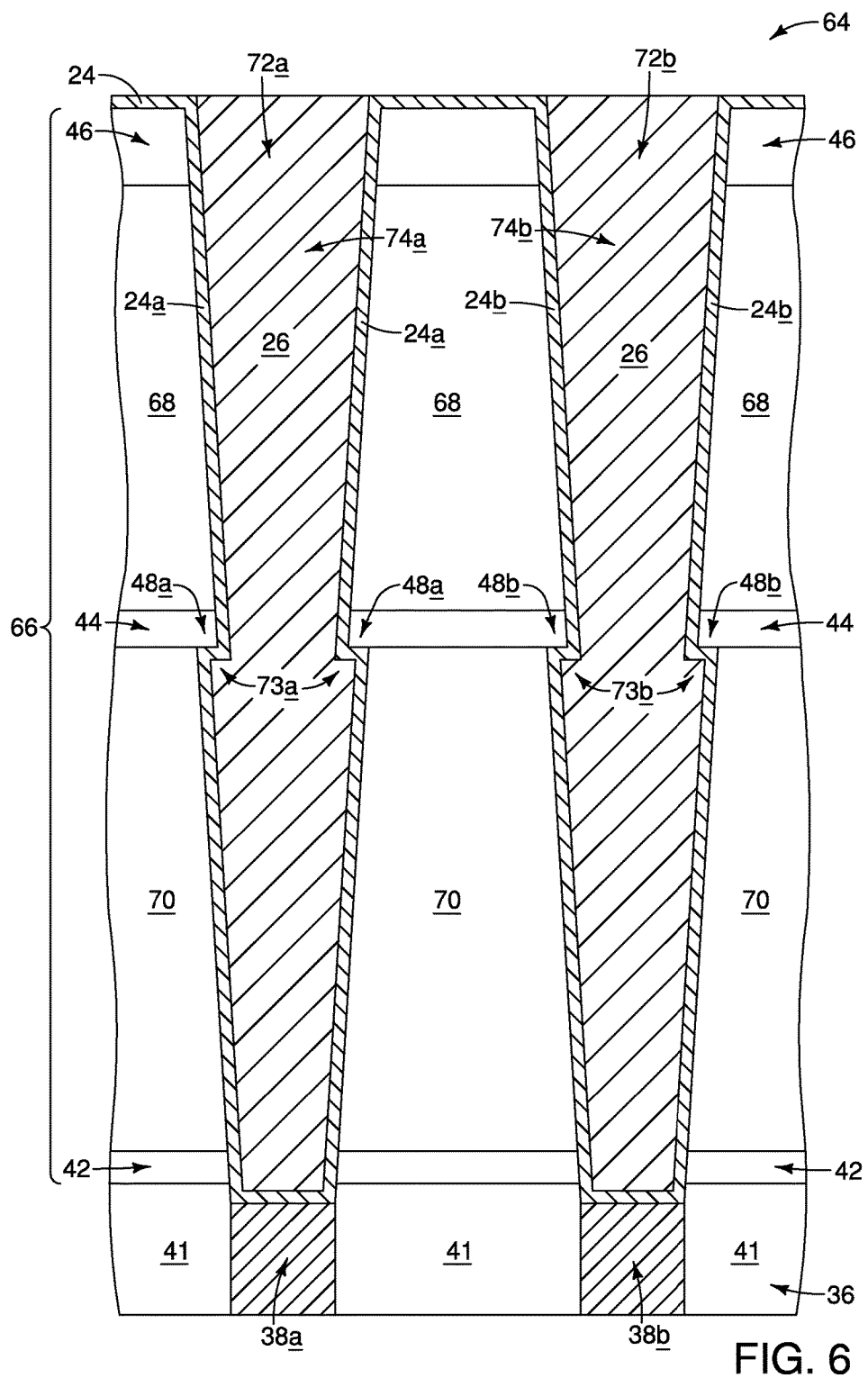

Referring to FIG. 6, the conductive fill material 26 is removed from over an upper surface of stack 66. Such removal may be accomplished utilizing any suitable processing. In some embodiments, such processing may include a dry etch-back of the material 26 (for instance, a dry etch-back of polysilicon in applications in which material 26 is conductively-doped silicon).

Figure 7:
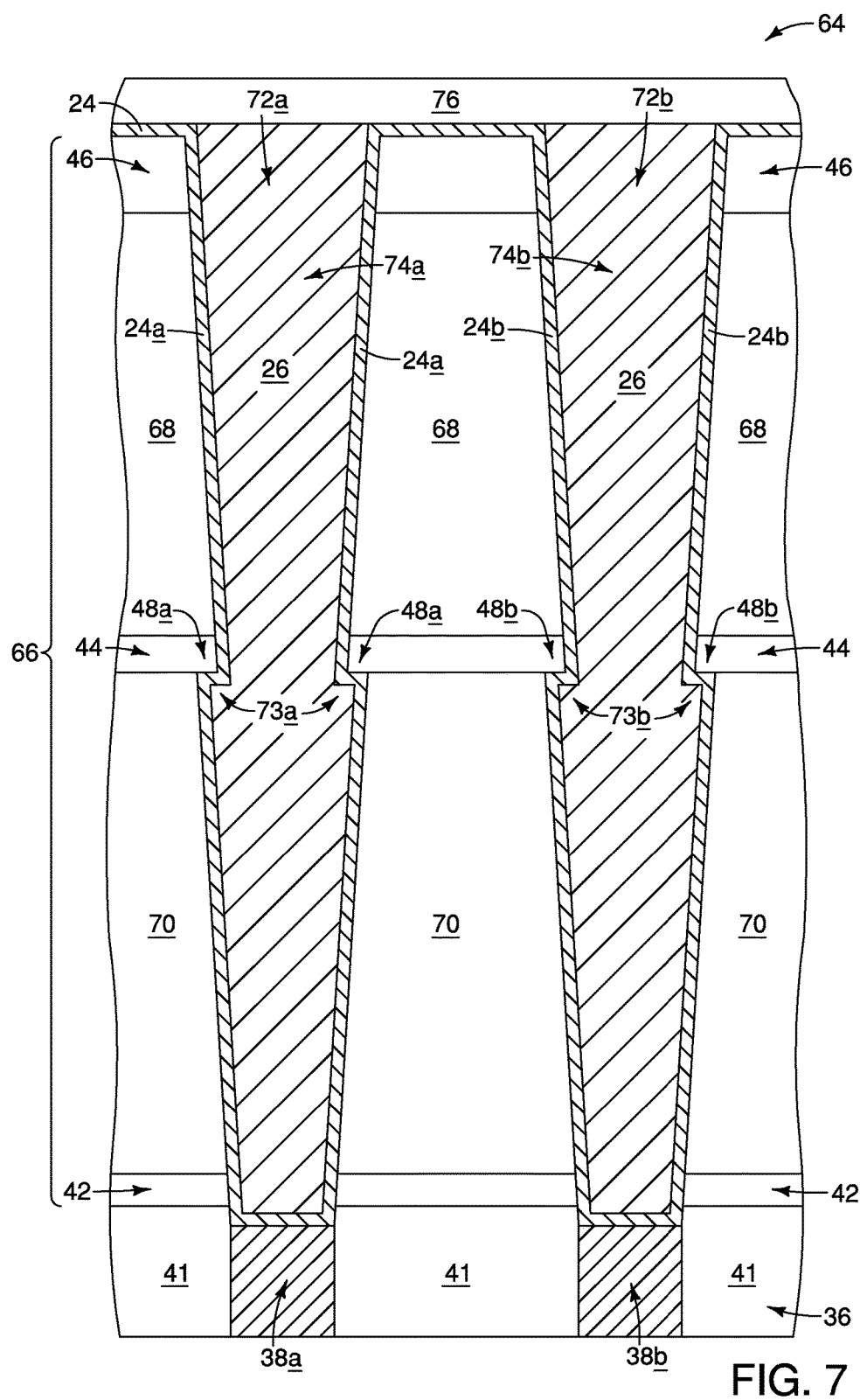

Referring to FIG. 7, insulative material 76 is formed over an upper surface of the stack 66, and over upper surfaces of the conductive structures 74a and 74b. The insulative material 76 may comprise any suitable composition(s); and in some embodiments may comprise, consist essentially of, or consist of silicon dioxide.

Figure 8:
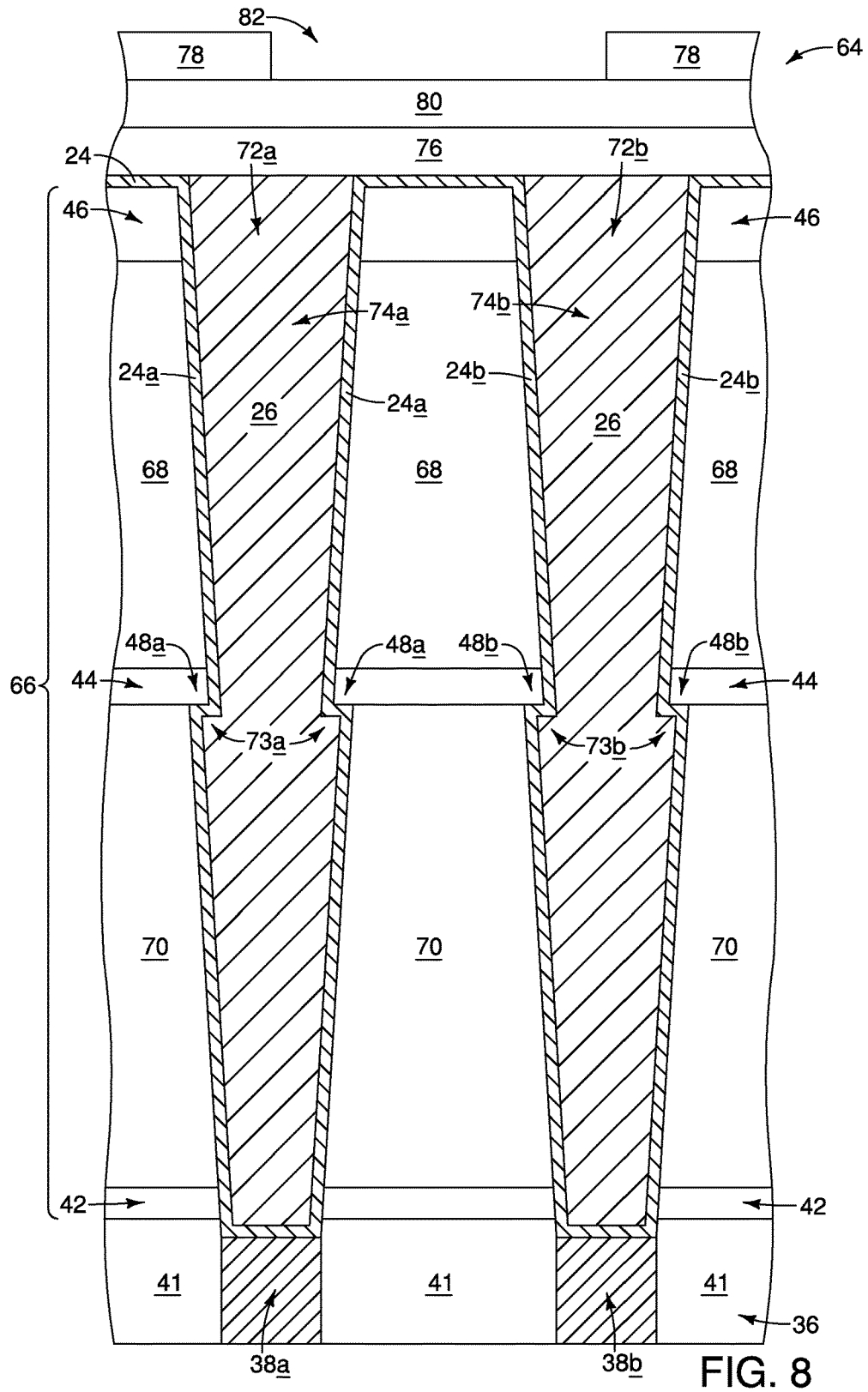

Referring to FIG. 8, materials 78 and 80 are formed over the insulative material 76. The material 78 may comprise photoresist, and the material 80 may be a multilayer resist system (for instance, may comprise polymethylmethacrylate). The photoresist 78 may be photolithographically patterned to have the opening 82 extending therethrough.

Figure 9:
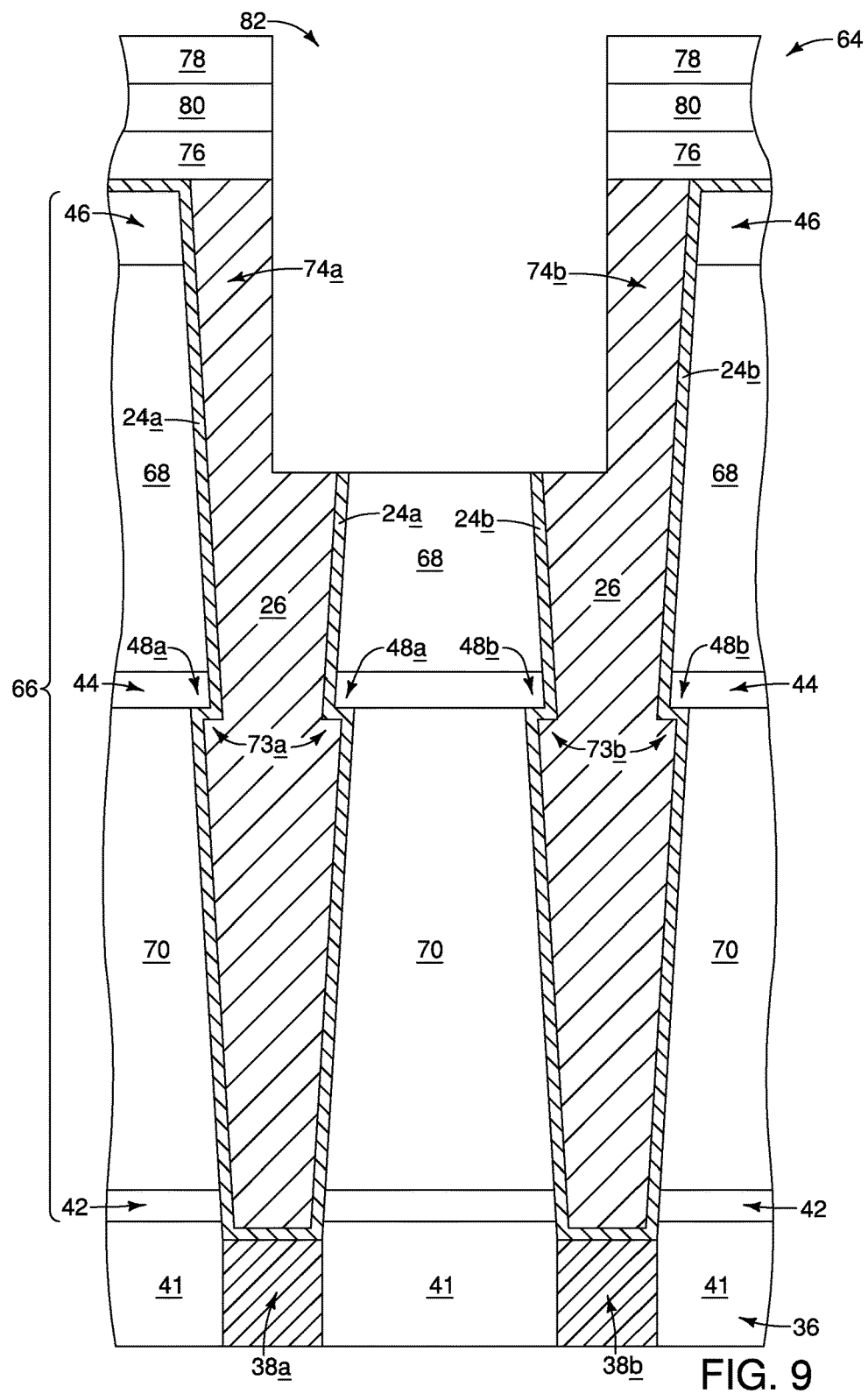

Referring to FIG. 9, the opening 82 is extended into the conductive structures 74a and 74b, and into the first sacrificial material 68. The opening 82 may be referred to as a second opening. The second opening 82 partially overlaps the first and second conductive structures 74a and 74b, and exposes the first sacrificial material 68. The second opening 82 may be considered to partially overlap each of the conductive structures 74a and 74b, and to recess regions of the conductive structures while leaving other regions not recessed.

Figure 10:
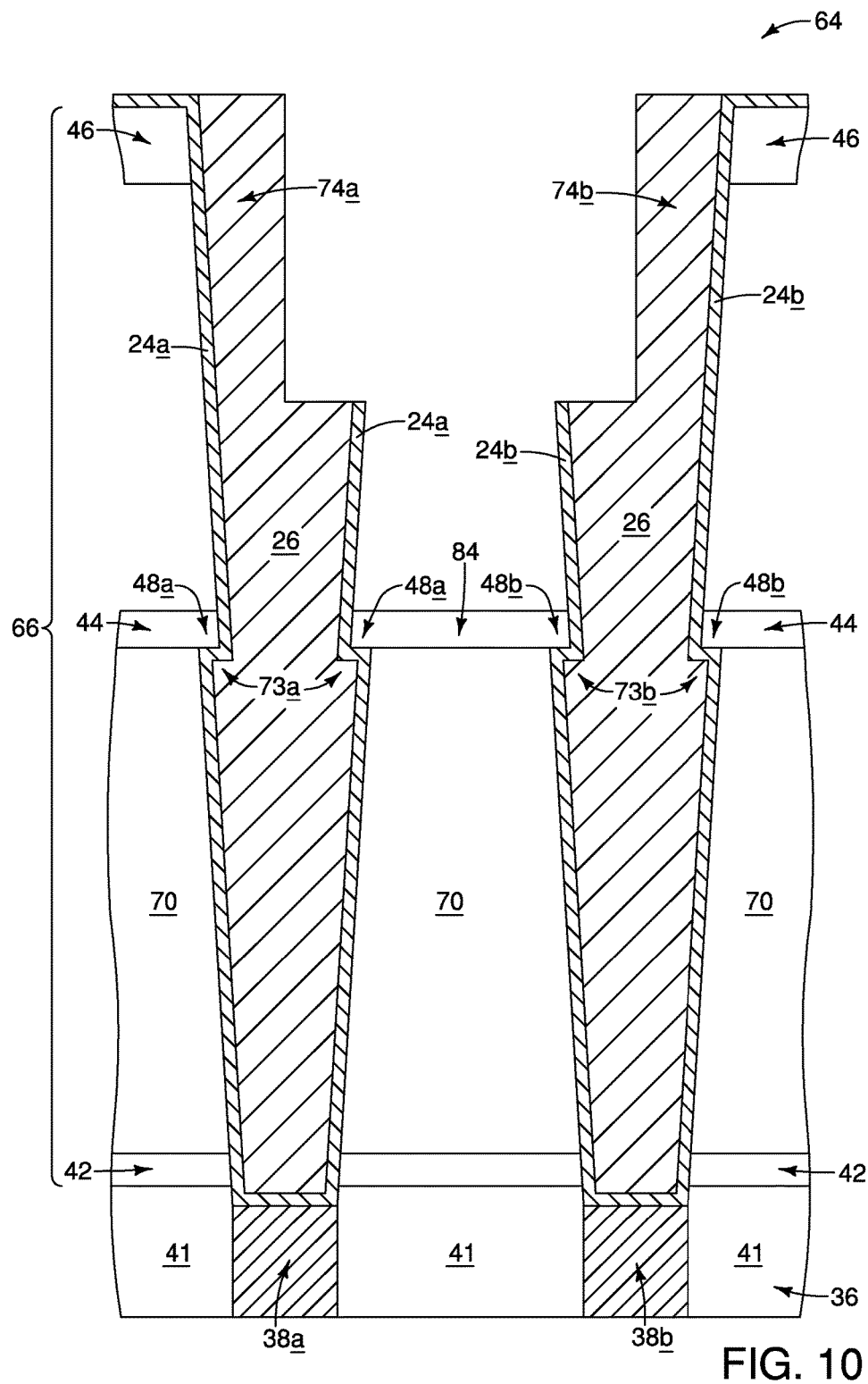

Referring to FIG. 10, materials 76, 80 and 78 (FIG. 9) are removed, and the second sacrificial material 68 (FIG. 9) is also removed. The removal of the materials 68, 76, 78 and 80 may be accomplished with any suitable etch or combination of etches.

After the first sacrificial material 68 (FIG. 9) is removed, a region of the lattice layer 44 between the conductive structures 74a and 74b is exposed; with such exposed region being labeled as a region 84 at the processing stage of FIG. 10.

Figure 11:
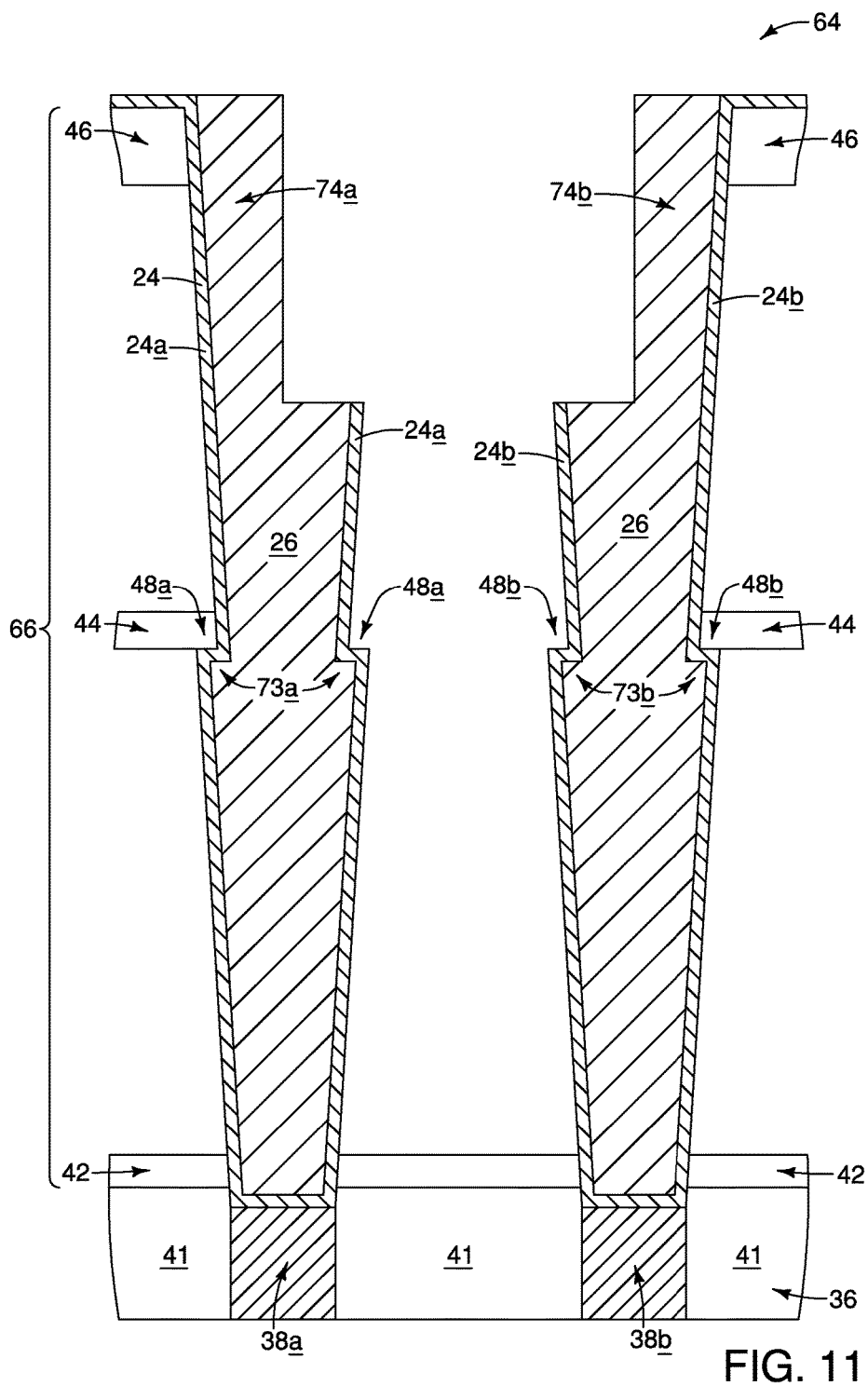

Referring to FIG. 11, the exposed region 84 (FIG. 10) of the lattice layer 44 is removed, and then the second sacrificial material 70 (FIG. 10) is removed.

Figure 12:
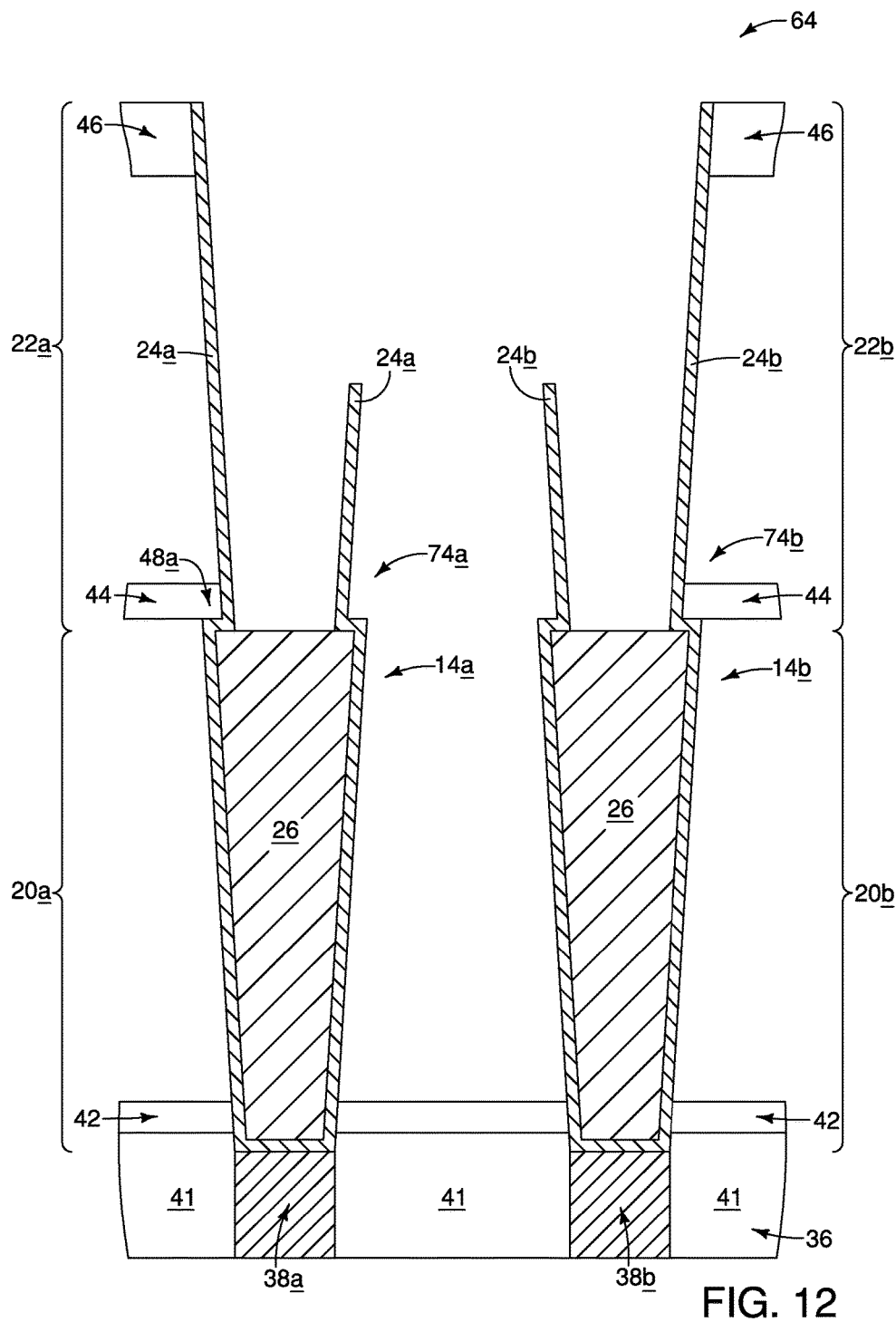

Referring to FIG. 12, a portion of the conductive fill material 26 is removed from each of the first and second conductive structures 74a and 74b to form the first and second conductive structures into first and second bottom electrodes 14a and 14b, respectively. The conductive fill material 26 may be removed with any suitable processing. In some embodiments, the conductive fill material 26 comprises polycrystalline silicon; and is removed with a wet etch utilizing tetramethyl ammonium hydroxide (TMAH). The amount of the conductive fill material 26 which is removed may be controlled by adjusting etchant concentration, etching time, temperature, etc. Accordingly, the amount of the conductive fill material 26 which is removed may be tailored for specific applications.

The first bottom electrode 14a has a first lower pillar region 20a comprising a remaining portion of the conductive fill material 26 laterally surrounded by a lower region of the first conductive liner 24a. The first bottom electrode 14a also has a first upper container region 22a comprising an upper region of the first conductive liner 24a.

The second bottom electrode 14b has a second lower pillar region 20b comprising a second remaining portion of the conductive fill material 26 laterally surrounded by a lower region of the second conductive liner 24b. The second bottom electrode 14b also has a second upper container region 22b comprising an upper region of the second conductive liner 24b.

Figure 13:
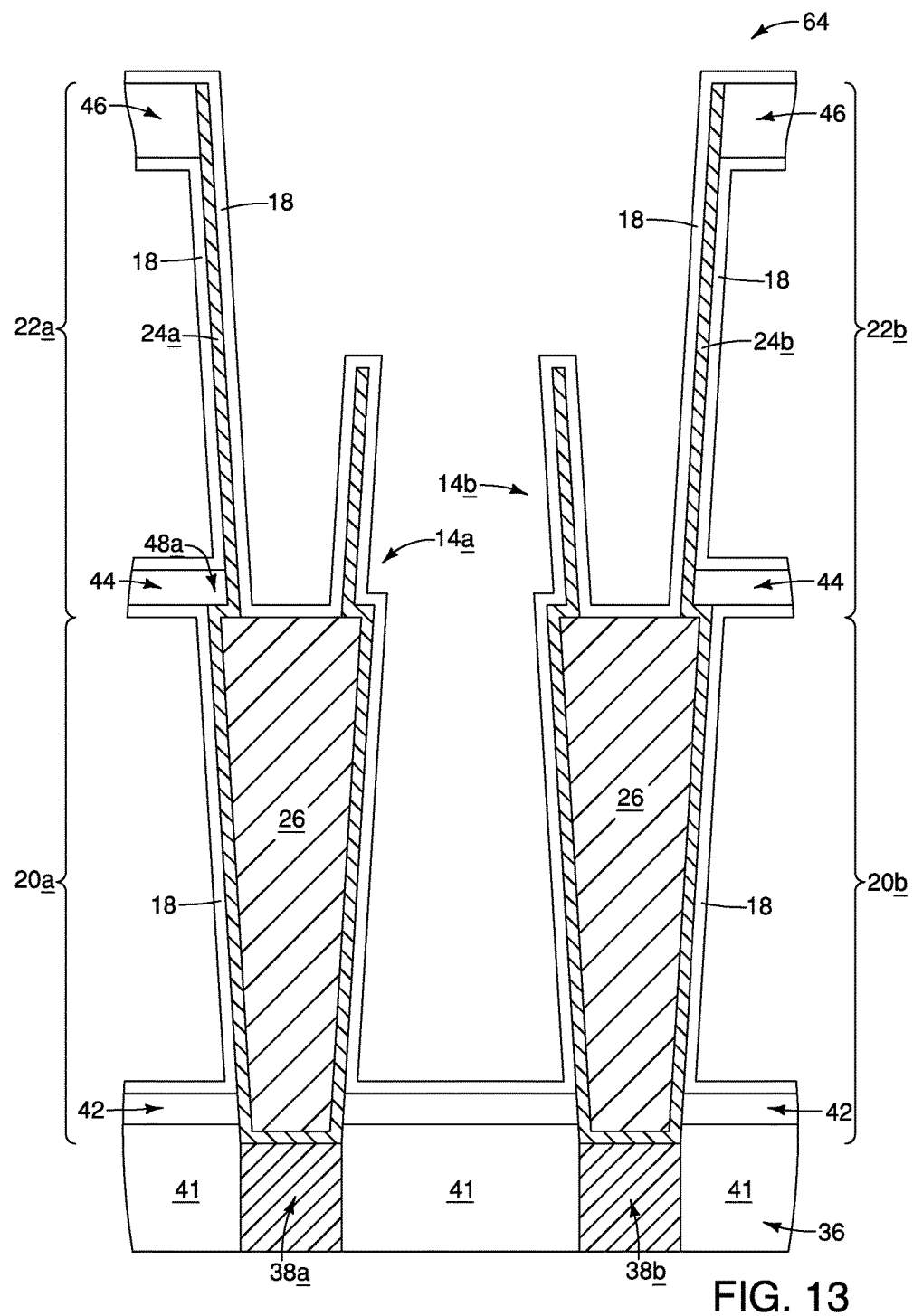

Referring to FIG. 13, dielectric material 18 is formed along the first and second bottom electrodes 14a and 14b.

Figure 14:
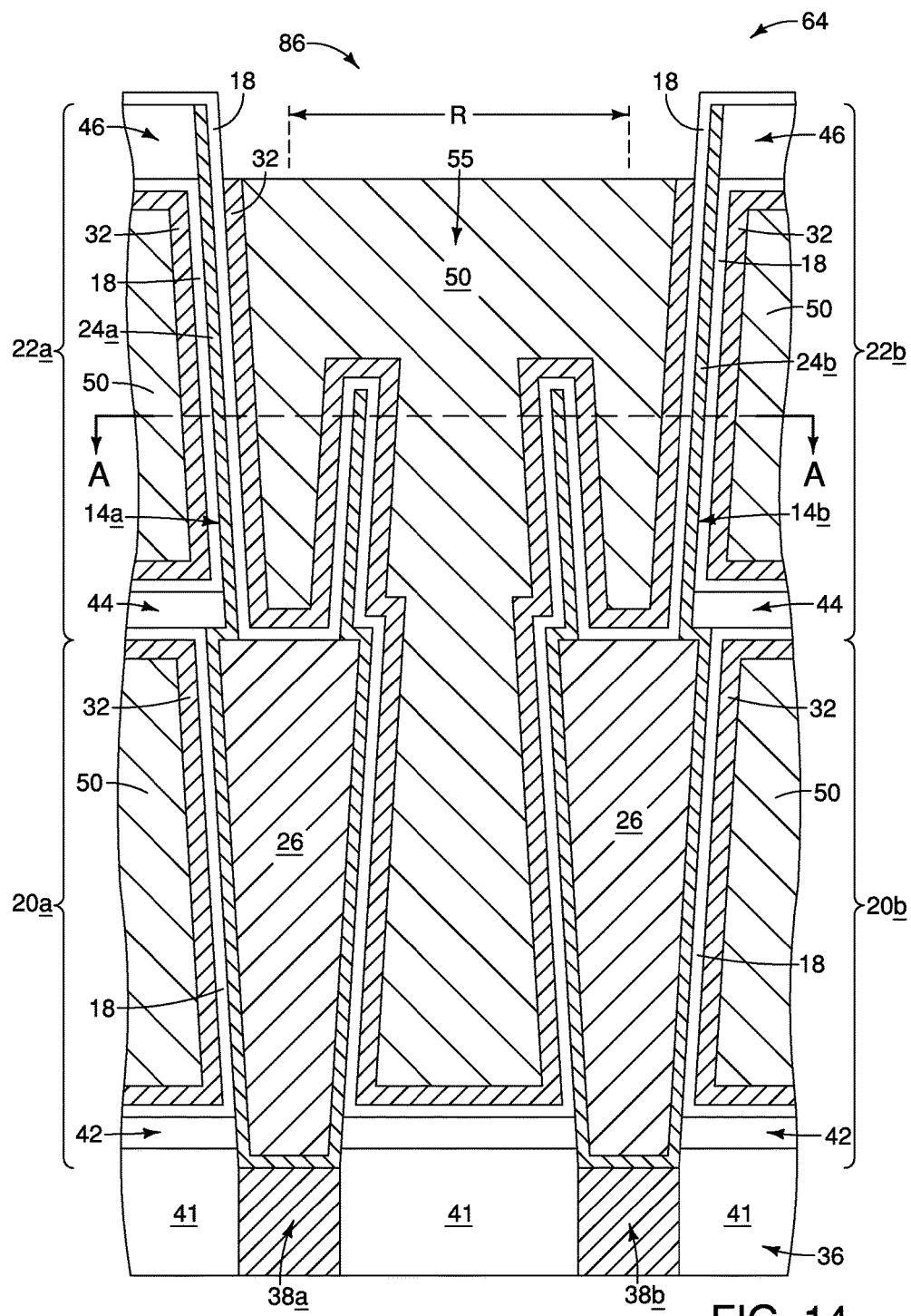

Referring to FIG. 14, the conductive materials 32 and 50 are provided to form the common upper electrode 55. The common upper electrode 55 extends along the dielectric material 18, and is spaced from the first and second bottom electrodes 14a and 14b by the dielectric material 18.

Figure 14A:
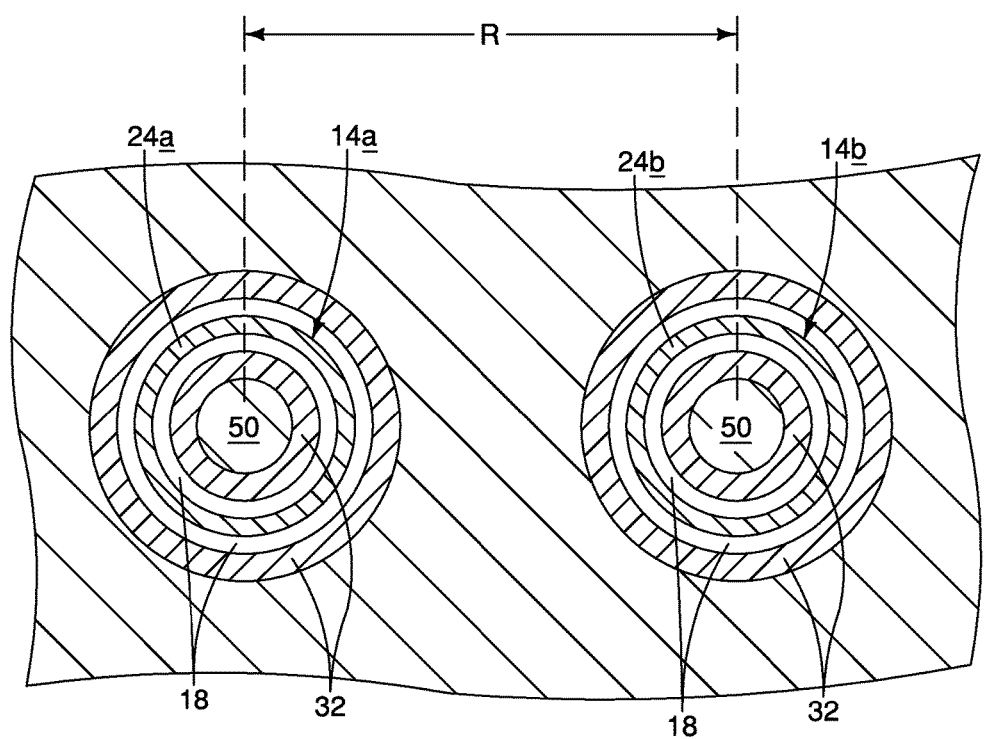
FIG. 14A is a sectional view along the line A-A of FIG. 14.

An opening 86 is formed to extend into the upper electrode 55. In some embodiments, the opening 86 may be considered to be over the recessed regions of the bottom electrodes 14a and 14b. For instance, recessed regions of the bottom electrodes 14a and 14b are diagrammatically illustrated as being approximately within a region labeled "R" in FIG. 14. The opening 86 extends across such region R. FIG. 14A shows a cross-section along a line A-A of FIG. 14 and diagrammatically illustrates an approximate location of the region R relative to the shown embodiment.

Figure 15:
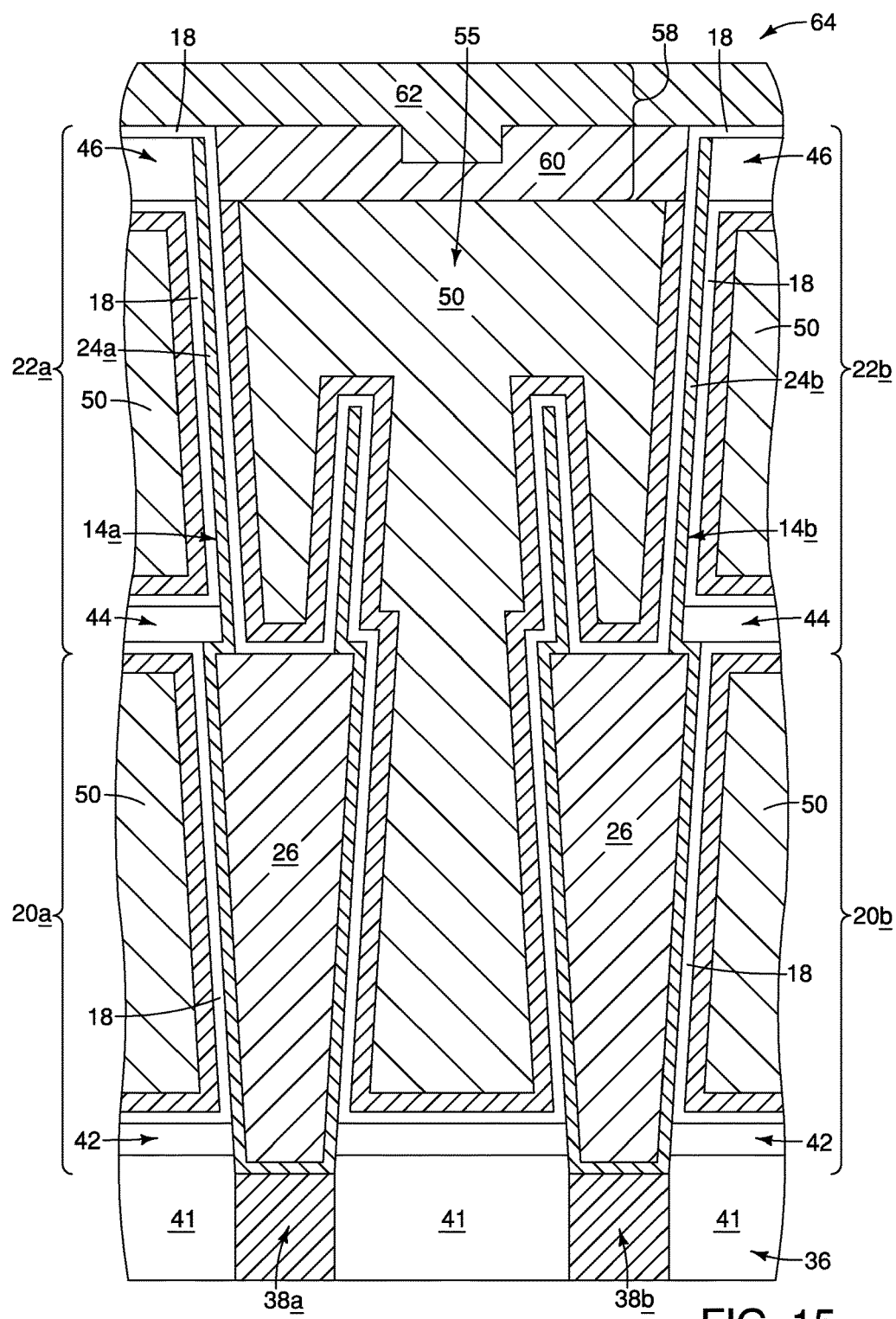

Referring to FIG. 15, the conductive interconnect 58 is formed to extend into the opening 86 (with the opening 86 being labeled in FIG. 14), and to be electrically coupled with the upper electrode 55. In the illustrated embodiment, the conductive interconnect 58 comprises the first and second materials 60 and 62 described above with reference to FIG. 2. In some embodiments, the first material 60 may comprise conductively-doped semiconductor material directly against the upper electrode 55, and the second material 62 may be a metal-containing material. For instance, the material 60 may comprise conductively-doped silicon, and the material 16 may comprise tungsten.

Figure 16:
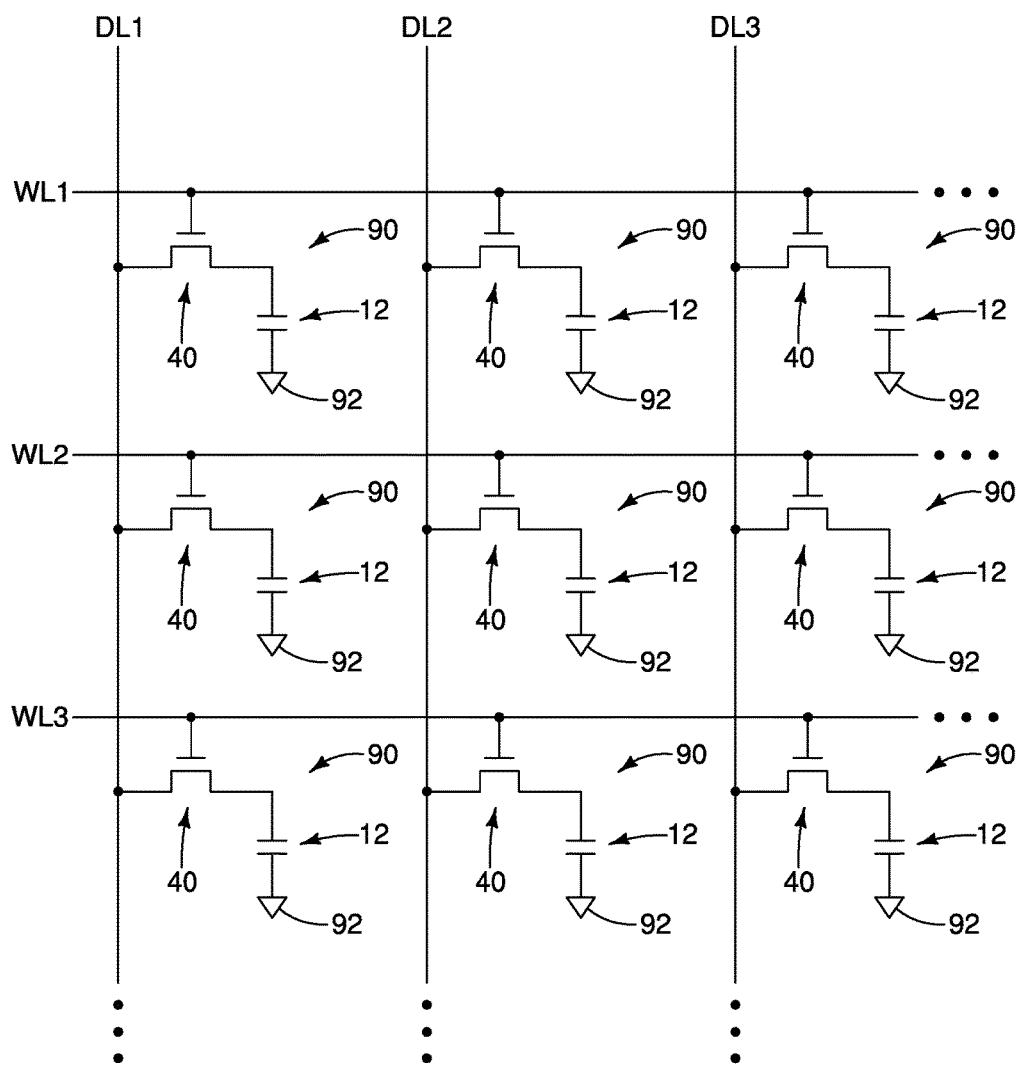
FIG. 16 is a schematic diagram of a region of an example memory array.

The capacitors described above may be utilized in a memory array, such as, for example, a DRAM array. FIG. 16 schematically illustrates an example DRAM array. The array includes a plurality of wordlines WL1, WL2 and WL3 extending along rows of the array; and includes a plurality of digit lines DL1, DL2 and DL3 extending along columns of the array. Memory cells 90 comprise transistors 40 in combination with capacitors 12. The capacitors may have the configuration of FIG. 1, or the configuration of FIG. 2. If the capacitors have the configuration of FIG. 2, then some of the capacitors will have the configuration 12a (FIG. 2) while others have the configuration 12b (FIG. 2).

Each of the transistors 40 of FIG. 16 has a gate electrode coupled with one of the wordlines (WL1, WL2, WL3), and has a source/drain region coupled with one of the digit lines (DL1, DL2, DL3). Each of the transistors 40 also has a source/drain region electrically coupled with one of the capacitors 12. Each of the capacitors 12 has a storage node (or bottom electrode) which is electrically coupled with the source/drain region of the associated transistor 40, and has a second electrode (or upper electrode) which is electrically coupled with a reference voltage 92. The reference voltage 92 may be, for example, ground, VCC/2, etc.

The schematic illustration of FIG. 16 shows nine memory cells 90. Such memory cells may be part of a large memory array; and may be representative of hundreds, thousands, millions, billions, etc., of the memory cells within the array.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a capacitor which includes a first electrode having a lower pillar portion and an upper container portion over the lower pillar portion. The lower pillar portion has an outer surface. The upper container portion has an inner surface and an outer surface. Dielectric material lines the inner and outer surfaces of the upper container portion, and lines the outer surface of the lower pillar portion. A second electrode extends along the inner and outer surfaces of the upper container portion, and along the outer surface of the lower pillar portion. The second electrode is spaced from the first electrode by the dielectric material.

Some embodiments include a capacitor having a lower pillar portion. The lower pillar portion includes a lower portion of a conductive liner, and includes a conductive fill material laterally surrounded by the lower portion of the conductive liner. The lower pillar portion has an outer surface along an outer edge of the lower portion of the conductive liner. An upper container portion is over the lower pillar portion. The upper container portion comprises an upwardly-opening conductive container. The upwardly-opening conductive container comprises a sidewall corresponding to an upper portion of the conductive liner, and comprises a bottom corresponding to an upper surface of the conductive fill material. The upper container portion has an inner surface along an inner edge of the sidewall and along the upper surface of the conductive fill material, and has an outer surface along an outer edge of the sidewall. A first electrode of the capacitor comprises the lower pillar portion and the upper container portion. dielectric material lines the inner and outer surfaces of the upper container portion, and lines the outer surface of the lower pillar portion. A second electrode of the capacitor extends along the inner and outer surfaces of the upper container portion, and along the outer surface of the lower pillar portion. The second electrode is spaced from the first electrode by the dielectric material.

Some embodiments include an assembly comprising a pair of neighboring capacitors. One of the neighboring capacitors is a first capacitor and the other of the neighboring capacitors is a second capacitor. The first capacitor comprises a first bottom electrode which includes a first lower pillar portion under a first upper container portion. The first lower pillar portion comprises a first pillar outer surface. The first upper container portion comprises a first container inner surface and a first container outer surface. The second capacitor comprises a second bottom electrode which includes a second lower pillar portion under a second upper container portion. the second lower pillar portion comprises a second pillar outer surface. the second upper container portion comprises a second container inner surface and a second container outer surface. Dielectric material is along the first pillar outer surface, the first container inner surface, the first container outer surface, the second pillar outer surface, the second container inner surface and the second container outer surface. A common upper electrode extends along the first and second bottom electrodes, and is spaced from the first and second bottom electrodes by the dielectric material. A recess extends downwardly into the first and second upper container portions and partially overlaps each of the first and second upper container portions. Regions of each of the first and second upper container portions are recessed, and other regions of each of the first and second upper container portions are non-recessed. A conductive interconnect is electrically coupled with the common upper electrode and is over the recessed regions of the first and second upper container portions.

Some embodiments include a method of forming an assembly. A stack is formed to comprise a first sacrificial material over a second sacrificial material, and to comprise a lattice layer between the first and second sacrificial materials. A pair of neighboring first openings are formed to extend through the first and second sacrificial materials, and through the lattice layer. Conductive liners are formed along inner surfaces of the neighboring first openings to narrow the neighboring first openings. The conductive liner within one of the neighboring first openings is a first conductive liner, and the conductive liner within the other of the neighboring first openings is a second conductive liner. Conductive fill material is formed within the narrowed neighboring first openings to fill the narrowed neighboring first openings. The conductive fill material within said one of the neighboring first openings, together with the first conductive liner, form a first conductive structure; and the conductive fill material within said other of the neighboring first openings, together with the second conductive liner, form a second conductive structure. A second opening is formed to partially overlap the first and second conductive structures. The second opening extends to the conductive fill material of the first and second conductive structures, and extends to the first sacrificial material. The first sacrificial material is removed to expose a region of the lattice layer between the first and second conductive structures. The exposed region of the lattice layer is removed, and then the second sacrificial material is removed. A portion of the conductive fill material from each of the first and second conductive structures is removed to form the first and second conductive structures into first and second bottom electrodes, respectively. The first bottom electrode has a first lower pillar region comprising a first remaining portion of the conductive fill material laterally surrounded by a lower region of the first conductive liner, and has a first upper container region over the first lower pillar region and comprising an upper region of the first conductive liner. The second bottom electrode has a second lower pillar region comprising a second remaining portion of the conductive fill material laterally surrounded by a lower region of the second conductive liner, and has a second upper container region over the second lower pillar region and comprising an upper region of the second conductive liner. Dielectric material is formed along the first and second bottom electrodes. A common upper electrode is formed along the dielectric material and is spaced from the first and second bottom electrodes by the dielectric material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A capacitor, comprising:
   a lower pillar portion; the lower pillar portion having an outer surface;
   an upper container portion over the lower pillar portion; the upper container portion comprising an inner surface and an outer surface; a first electrode of the capacitor comprising the lower pillar portion and the upper container portion;
dielectric material lining the inner and outer surfaces of the upper container portion, and lining the outer surface of the lower pillar portion; and
a second electrode of the capacitor extending along the inner and outer surfaces of the upper container portion, and along the outer surface of the lower pillar portion; the second electrode being spaced from the first electrode by the dielectric material.

2. The capacitor of claim 1, where the lower pillar portion has a first height, the upper container portion has a second height, and the first and second heights together equal a total height of the first electrode; and where the first height is at least about one-half of the total height.

3. The capacitor of claim 1, where the lower pillar portion has a first height, the upper container portion has a second height, and the first and second heights together equal a total height of the first electrode; and where the first height is less than about one-half of the total height.

4. The capacitor of claim 1, where the lower pillar portion has a first height, the upper container portion has a second height, and the first and second heights together equal a total height of the first electrode; and where the first height is within a range of from about 10% of the total height to about 75% of the total height.

5. A capacitor, comprising:
a lower pillar portion; the lower pillar portion including a lower portion of a conductive liner, and including a conductive fill material laterally surrounded by the lower portion of the conductive liner; the lower pillar portion having an outer surface along an outer edge of the lower portion of the conductive liner;
an upper container portion over the lower pillar portion; the upper container portion comprising an upwardly-opening conductive container; the upwardly-opening conductive container comprising a sidewall corresponding to an upper portion of the conductive liner, and comprising a bottom corresponding to an upper surface of the conductive fill material; the upper container portion having an inner surface along an inner edge of the sidewall and along the upper surface of the conductive fill material, and having an outer surface along an outer edge of the sidewall; a first electrode of the capacitor comprising the lower pillar portion and the upper container portion;
dielectric material lining the inner and outer surfaces of the upper container portion, and lining the outer surface of the lower pillar portion; and
a second electrode of the capacitor extending along the inner and outer surfaces of the upper container portion, and along the outer surface of the lower pillar portion; the second electrode being spaced from the first electrode by the dielectric material.

6. The capacitor of claim 5, where the conductive liner comprises metal and the conductive fill material comprises doped semiconductor material.

7. The capacitor of claim 6, where the conductive liner comprises titanium and the conductive fill material comprises doped silicon.

8. The capacitor of claim 7, where the conductive liner comprises TiN; where the chemical formula indicates primary constituents rather than indicating a specific stoichiometry.

9. The capacitor of claim 5, comprising a step along the conductive liner proximate where the upper portion of the conductive liner joins to the lower portion of the conductive liner, the step including a region of the upper portion of the conductive liner which is laterally inset relative to an inner edge of the lower portion of the conductive liner.

10. The capacitor of claim 9, comprising an insulative lattice directly against an outer edge of step.

11. An assembly, comprising:
a pair of neighboring capacitors; one of the neighboring capacitors being a first capacitor and the other of the neighboring capacitors being a second capacitor;
the first capacitor comprising a first bottom electrode which includes a first lower pillar portion under a first upper container portion; the first lower pillar portion comprising a first pillar outer surface; the first upper container portion comprising a first container inner surface and a first container outer surface;
the second capacitor comprising a second bottom electrode which includes a second lower pillar portion under a second upper container portion; the second lower pillar portion comprising a second pillar outer surface; the second upper container portion comprising a second container inner surface and a second container outer surface;
dielectric material along the first pillar outer surface, the first container inner surface, the first container outer surface, the second pillar outer surface, the second container inner surface and the second container outer surface;
a common upper electrode extending along the first and second bottom electrodes, and being spaced from the first and second bottom electrodes by the dielectric material;
a recess extending downwardly into the first and second upper container portions and partially overlapping each of the first and second upper container portions; regions of each of the first and second upper container portions being recessed, and other regions of each of the first and second upper container portions being non-recessed; and
a conductive interconnect electrically coupled with the common upper electrode and being over the recessed regions of the first and second upper container portions.

12. The assembly of claim 11, comprising an insulative lattice directly against the non-recessed regions of the first and second upper container portions.

13. The assembly of claim 11, where the conductive interconnect includes conductively-doped semiconductor material directly against the common second electrode, and includes metal-containing material directly against the conductively-doped semiconductor material.

14. The assembly of claim 13, where the conductively-doped semiconductor material comprises conductively-doped silicon, and where the metal-containing material comprises tungsten.

15. The assembly of claim 11, comprising a first step proximate where the first lower pillar portion joins to the first upper container portion, and comprising a second step proximate where the second lower pillar portion joins to the second upper container portion; the first step comprising a region of the first container outer surface which is inset relative to a region of the first pillar outer surface; the second step comprising a region of the second container outer surface which is inset relative to a region of the second pillar outer surface.

16. The assembly of claim 15, comprising an insulative lattice directly against the first and second steps.

* * * * *